(12) United States Patent
Yang

(10) Patent No.: US 10,810,910 B2
(45) Date of Patent: Oct. 20, 2020

(54) FLEXIBLE SCREEN PROTECTION STRUCTURE AND METHOD FOR MANUFACTURING THE SAME, AND FLEXIBLE DISPLAY SCREEN USING THE SAME

(71) Applicant: SHENZHEN ROYOLE TECHNOLOGIES CO. LTD., Shenzhen (CN)

(72) Inventor: Songling Yang, Shenzhen (CN)

(73) Assignee: SHENZHEN ROYOLE TECHNOLOGIES CO. LTD., Shenzhen (CN)

( * ) Notice: Subject to any disclaimer, the term of this patent is extended or adjusted under 35 U.S.C. 154(b) by 502 days.

(21) Appl. No.: 15/616,126

(22) Filed: Jun. 7, 2017

(65) Prior Publication Data
US 2017/0270835 A1   Sep. 21, 2017

Related U.S. Application Data

(63) Continuation of application No. PCT/CN2014/093229, filed on Dec. 8, 2014.

(51) Int. Cl.
| G09F 9/30 | (2006.01) |
| H01L 27/32 | (2006.01) |
| H01L 51/00 | (2006.01) |
| G06F 1/16 | (2006.01) |
| H04M 1/02 | (2006.01) |

(52) U.S. Cl.
CPC ............ *G09F 9/301* (2013.01); *G06F 1/1652* (2013.01); *G09F 9/30* (2013.01); *H01L 27/32* (2013.01); *H01L 27/3244* (2013.01); *H01L 51/0097* (2013.01); *H01L 2251/5338* (2013.01); *H04M 1/0268* (2013.01)

(58) Field of Classification Search
CPC ...................................................... G06F 1/1652
See application file for complete search history.

(56) References Cited

U.S. PATENT DOCUMENTS

2008/0018631 A1   1/2008   Hioki et al.

FOREIGN PATENT DOCUMENTS

| CN | 1675969 A | 9/2005 |
| CN | 101133434 A | 2/2008 |
| CN | 101853608 A | 10/2010 |
| CN | 103985315 A | 8/2014 |
| JP | 56116225 A | 9/1981 |

(Continued)

*Primary Examiner* — Ian A Rummel
(74) *Attorney, Agent, or Firm* — Hauptman Ham, LLP

(57) ABSTRACT

A flexible screen protection structure includes a first flexible plate, a second flexible plate opposite to the first flexible plate, a side plate, a number of first trapezoidal bosses, and a number of second trapezoidal bosses. A gap is formed between the first flexible plate and the second flexible plate. The side plate surrounds peripheral sides of the first flexible plate and the second flexible plate, and closes the gap. The first trapezoidal bosses are densely distributed on the first flexible plate and located in the gap. Each first trapezoidal boss includes a large end attached to the first flexible plate and a small end facing the second flexible plate. The second trapezoidal bosses are densely distributed on the second flexible plate and located in the gap. Each second trapezoidal boss includes a large end attached to the second flexible plate and a small end facing the first flexible plate.

17 Claims, 6 Drawing Sheets

(56) References Cited

FOREIGN PATENT DOCUMENTS

| | | |
|---|---|---|
| JP | 20040071765 A | 3/2004 |
| JP | 2004279867 A | 10/2004 |
| JP | 2005-516372 A | 6/2005 |
| JP | 20080026710 A | 2/2008 |
| JP | 2009170173 A | 7/2009 |
| JP | 20140161009 A | 9/2014 |
| WO | 2006090434 A | 7/2008 |

FLEXIBLE SCREEN PROTECTION STRUCTURE AND METHOD FOR MANUFACTURING THE SAME, AND FLEXIBLE DISPLAY SCREEN USING THE SAME

CROSS REFERENCE TO RELATED APPLICATIONS

This application is a continuation application of PCT Patent Application No. PCT/CN2014/093229, filed on Dec. 8, 2014, which is hereby incorporated by reference in its entireties.

TECHNICAL FIELD

The present disclosure relates to the field of flexible screens, and particularly to a flexible screen protection structure and a method for manufacturing the same, and a flexible display screen using the same.

BACKGROUND ART

With the development of flexible display technology, not only small-range bending of a fixed radian of a flexible display screen can be realized, but also any bending of a large curvature and even winding can be realized. However, at present, the bending curvature of the flexible display screen still has a certain maximum limit, for example, right-angle flexing cannot be realized. When a bending degree of the flexible display screen exceeds an allowable maximum limit and the flexible display screen is even flexed, the flexible display screen will be bent and cracked, i.e. deflection phenomenon will occur, which causes that the flexible display screen cannot be normally used. Therefore, it is necessary to provide a protection structure which can prevent the flexible display screen from being damaged during the bending process.

SUMMARY

The object of the present disclosure is to provide a flexible screen protection structure that improves deflection resistance, a method for manufacturing the same, and a flexible display screen using the same.

In order to solve the above problems, the present disclosure provides a flexible screen protection structure. The flexible screen protection structure includes a first flexible plate, a second flexible plate, a side plate, a number of first trapezoidal bosses, and a number of second trapezoidal bosses.

The second flexible plate is provided opposite to the first flexible plate, and a gap is formed between the first flexible plate and the second flexible plate.

The side plate surrounds peripheral sides of the first flexible plate and peripheral sides of the second flexible plate, and closes the gap.

The first trapezoidal bosses are densely distributed on the first flexible plate and located in the gap, and each first trapezoidal boss includes a large end attached to the first flexible plate and a small end facing the second flexible plate.

The second trapezoidal bosses are densely distributed on the second flexible plate and located in the gap, and each second trapezoidal boss includes a large end attached to the second flexible plate and a small end facing the first flexible plate.

The first flexible plate is made from an elastic material, and the first flexible plate is able to restore to an expanded state after being bent.

The second flexible plate is made from an elastic material, and the second flexible plate is able to restore to an expanded state after being bent.

The side plate is made from an elastic material, and the side plate is able to restore to an expanded state after being bent.

The gap is filled with electrorheological fluid, and a voltage is allowed to be applied between the first flexible plate and the second flexible plate.

The first flexible plate and the second flexible plate are magnetically attracted to each other.

The first trapezoidal bosses and the second trapezoidal bosses are coupled in series through a cable.

The first trapezoidal bosses are arranged into array on the first flexible plate, and the second trapezoidal bosses are arranged into array on the second flexible plate.

The first trapezoidal bosses are respectively provided opposite to the second trapezoidal bosses one to one.

The first trapezoidal bosses and the second trapezoidal bosses are trapezoidal truncated cones.

An atmospheric pressure intensity in the gap is smaller than an atmospheric pressure intensity outside the flexible screen protection structure.

The present disclosure further provides a flexible display screen. The flexible display screen includes the flexible screen protection structure of any one of the above, and the flexible display screen further includes an organic light-emitting display layer. The organic light-emitting display layer is stacked on the flexible screen protection structure.

The organic light-emitting display layer is stacked on a surface of the first flexible plate facing away from the second flexible plate or on a surface of the second flexible plate facing away from the first flexible plate.

The present disclosure further provides a method for manufacturing a flexible screen protection structure, and the flexible screen protection structure of any one of the above is manufactured by the method for manufacturing a flexible screen protection structure. The method for manufacturing a flexible screen protection structure includes steps of: providing a first flexible plate having a predetermined profile and a second flexible plate having a predetermined profile; punching holes in a number of predetermined positions of the first flexible plate and the second flexible plate; placing the first flexible plate provided with the punched holes in an injection mold of first trapezoidal bosses for injection molding; placing the second flexible plate provided with the punched holes in an injection mold of second trapezoidal bosses for injection molding; arranging the first trapezoidal bosses to abut against the second trapezoidal bosses; encapsulating peripheral sides of the first flexible plate and the second flexible plate simultaneously with a side plate.

For the flexible screen protection structure of the present disclosure, by providing the first trapezoidal bosses and the second trapezoidal bosses respectively on the first flexible plate and the second flexible plate, and using the clearances existing between the small ends of the first trapezoidal bosses and the clearances between the small ends of the second trapezoidal bosses, the flexible screen protection structure can be bent to a certain degree. When the flexible screen protection structure is to be deflected, the small ends of the first trapezoidal bosses or the small ends of the second trapezoidal bosses abut against each other, so that the flexible screen protection structure cannot be bent any longer, thus deflection of the flexible screen protection structure can be prevented, and the deflection resistance can be further improved.

BRIEF DESCRIPTION OF THE DRAWINGS

In order to more clearly illustrate the technical solutions of the present disclosure, figures which are needed in the embodiments will be introduced briefly below. Apparently, the figures in the description below are merely for some embodiments of the present disclosure, and a person ordinarily skilled in the art still can obtain other figures according to these figures, without paying creative effort.

DETAILED DESCRIPTION

Below technical solutions of embodiments of the present disclosure will be described clearly and completely in conjunction with figures of the embodiments of the present disclosure.

Figure 1:
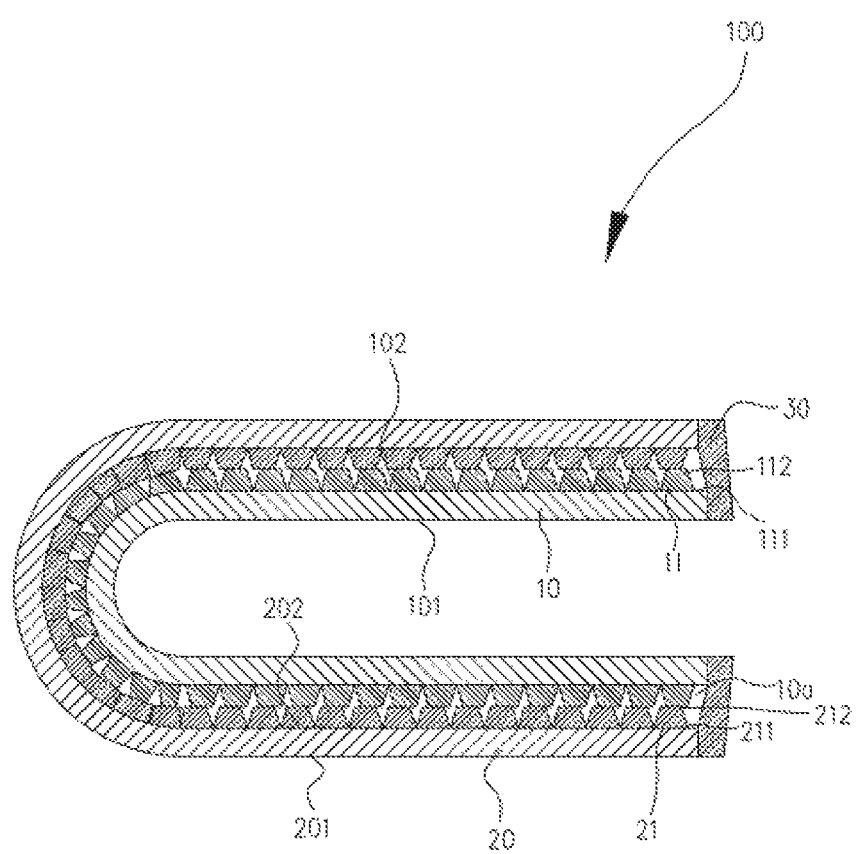
FIG. 1 is a sectional schematic view of a flexible screen protection structure in accordance with a first embodiment of the present disclosure.

Referring to FIG. 1, a first embodiment of the present disclosure provides a flexible screen protection structure 100. The flexible screen protection structure 100 includes a first flexible plate 10, a second flexible plate 20, a side plate 30, a number of first trapezoidal bosses 11, and a number of second trapezoidal bosses 21.

The second flexible plate 20 is arranged opposite to the first flexible plate 10, and a gap 10a is formed between the first flexible plate 10 and the second flexible plate 20.

The side plate 30 surrounds all peripheral sides of the first flexible plate 10 and all peripheral sides of the second flexible plate 20, and closes the gap 10a.

The first trapezoidal bosses 11 are densely distributed on the first flexible plate 10 and located in the gap 10a. Each first trapezoidal boss 11 includes a large end 111 attached to the first flexible plate 10 and a small end 112 facing the second flexible plate 20.

The second trapezoidal bosses 21 are densely distributed on the second flexible plate 20 and located in the gap 10a. Each second trapezoidal boss 21 includes a large end 211 attached to the second flexible plate 20 and a small end 212 facing the first flexible plate 10.

By providing the first trapezoidal bosses 11 and the second trapezoidal bosses 21 on the first flexible plate 10 and the second trapezoidal bosses 21 respectively, and making use of clearances existing between the small ends 112 of the first trapezoidal bosses 11 and clearances existing between the small ends 212 of the second trapezoidal bosses 21, the flexible screen protection structure 100 can be bent to a certain degree. When the small ends 112 of the first trapezoidal bosses 11 or the small ends 212 of the second trapezoidal bosses 21 abut against each other, a maximum bending limit of the flexible screen protection structure 100 is reached, the flexible screen protection structure 100 cannot be bent any longer, thus deflection of the flexible screen protection structure 100 can be prevented, and the deflection resistance can be further improved.

As a preferable embodiment, the first flexible plate 10 is a rectangular plate. The first flexible plate 10 can be bent freely. The first flexible plate 10 includes a first outer surface 101 and a first inner surface 102 opposite to the first outer surface 101. The first inner surface 102 faces the second flexible plate 20, and the first trapezoidal bosses 11 are densely distributed on the first inner surface 102. The first inner surface 102 can be bonded with the first trapezoidal bosses 11, or can be integrated with the first trapezoidal bosses 11, or still can be engaged with the first trapezoidal bosses 11. In other embodiments, the first flexible plate 10 still can be in a circular shape or other polygonal shapes.

As a preferable embodiment, the second flexible plate 20 is a rectangular plate. The second flexible plate 20 has a size equivalent to that of the first flexible plate 10, and has a second outer surface 201 and a second inner surface 202 opposite to the second outer surface 201. The second flexible plate 20 can have the same material and the same structure as the first flexible plate 10. Likewise, the second flexible plate 20 can be bent freely, and the second trapezoidal bosses 21 are arranged on the second inner surface 202 in a manner similar to that in which the first trapezoidal bosses 11 are provided, which will not be repeated herein.

As a preferable embodiment, the side plate 30 can be bent freely with the bending of the first flexible plate 10 and the second flexible plate 20.

Figure 2:
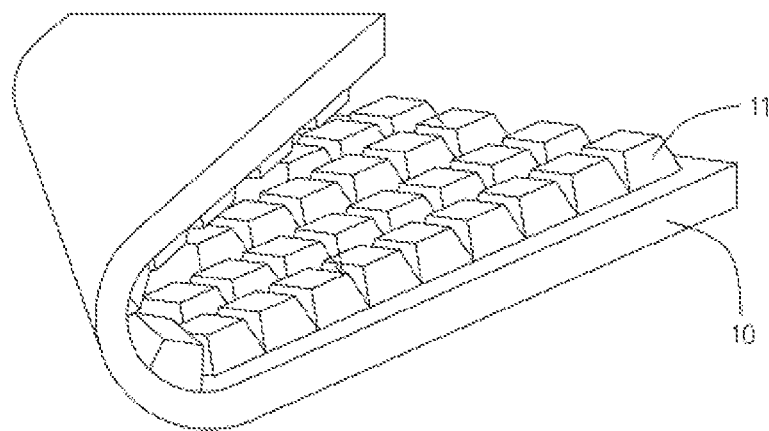
FIG. 2 is a schematic view showing a first flexible plate of the flexible screen protection structure of FIG. 1 bent along a diagonal line.

As a preferable embodiment, the first trapezoidal bosses 11 and the second trapezoidal bosses 21 are trapezoidal frustums of square pyramids (that is, sections in a direction perpendicular to the height of the bosses are trapezoidal as shown in FIG. 1 and FIG. 2). A clearance is formed between the small ends 112 of two adjacent first trapezoidal bosses 11, and the large ends 111 of two adjacent first trapezoidal bosses 11 abut against each other and both are fixed to the first inner surface 102. Similarly, a clearance is formed between the small ends 212 of two adjacent second trapezoidal bosses 21, and the large ends 211 of two adjacent second trapezoidal bosses 21 abut against each other and both are fixed to the second inner surface 202. As shown in FIG. 1, when the second flexible plate 20 is bent in the length direction or in the width direction, two adjacent second trapezoidal bosses 21 at the place where the second inner surface 202 is bent get close to each other, and the clearance between the small ends 212 of two adjacent second trapezoidal bosses 21 gradually decreases until the small ends 212 of the two adjacent second trapezoidal bosses 21 abut against each other. At the same time, corresponding to the bending place of the second flexible plate 20, the first flexible plate 10 is accordingly bent. And, the smaller ends 112 of the two adjacent first trapezoidal bosses 11 where the first flexible plate 10 is bent become more and more spread.

As shown on the left in FIG. 1, the bending of the second flexible plate 20 stops, then the second flexible plate 20 has a certain bending radius, and the second flexible plate 20 has no deflection, thus the second flexible plate 2C) can be protected, and the use efficiency of the flexible screen protection structure 100 can be improved. Similarly, when the first flexible plate 10 is bent in the length direction or in the width direction, two adjacent first trapezoidal bosses 11 at the place where the first inner surface 102 is bent get close to each other, and the clearance between the small ends 112 of two adjacent first trapezoidal bosses 11 gradually decreases until the small ends 112 of the two adjacent first trapezoidal bosses 21 abut against each other.

As a preferable embodiment, the first trapezoidal bosses 11 are arranged into arrays on the first flexible plate 10, and the second trapezoidal bosses 21 are also arranged into arrays on the second flexible plate 20. Specifically, the first trapezoidal bosses 11 are arranged into arrays in a length direction of the first flexible plate 10, and are arranged into arrays in a width direction of the first flexible plate 10, and the second trapezoidal bosses 21 are arranged into arrays in a length direction of the second flexible plate 20, and are arranged into arrays in a width direction of the second flexible plate 10. The large ends 111 of two adjacent first trapezoidal bosses 11 are closely connected, and the small ends 112 of two adjacent first trapezoidal bosses 11 are arranged to leave a gap. Similarly, the large ends 211 of two adjacent second trapezoidal bosses 21 are closely connected, and the small ends 212 of two adjacent second trapezoidal bosses 21 are arranged to leave a gap. As shown in FIG. 1, when the second flexible plate 20 is bent in the length direction or in the width direction, at the place where the second flexible plate 20 is bent, the small ends 212 of two adjacent columns of the second trapezoidal bosses 21 in the length or width direction get close to each other, so that the bending of the second flexible plate 20 in the length direction or the width direction has a certain bending radius. When the small ends 211 of two adjacent columns of the second trapezoidal bosses 21 in the length or width direction abut and stay together, the second flexible plate 20 cannot be bent any longer, so that the bending of the second flexible plate 20 in the length direction or in the width direction has a certain bending limit, thus deflection of the second flexible plate 20 can be prevented, and the second flexible plate 20 can be protected. Similarly, when the first flexible plate 10 is bent in the length direction or in the width direction, the first flexible plate 10 cannot be bent any longer when the small ends 112 of two adjacent columns of the first trapezoidal bosses 11 in the length or width direction abut and stay together. Thus, the bending of the first flexible plate 10 in the length direction or in the width direction has a certain bending limit, deflection of the first flexible plate 10 can be prevented, and the first flexible plate 10 can be protected.

Certainly, besides that the first flexible pate 10 can be bent in the length direction or in the width direction, and the bending in the length direction or in the width direction has a maximum bending limit, the first flexible plate 10 also can be bent in other directions, and the bending in each of the other directions has a maximum bending limit. For example, as shown in FIG. 2, the first flexible plate 10 can be bent along a diagonal direction, that is, at the place where the diagonal line, the small ends 112 of two adjacent lines of first trapezoidal bosses 11 can get close, so that the first flexible plate 10 can be bent at the place of the diagonal line. At the place of the diagonal line, when the small ends 111 of two adjacent lines of first trapezoidal bosses 11 abut against each other, the first flexible plate 10 cannot be bent any longer, thus the maximum bending limit of the first flexible plate 10 is reached. According to the same principle, the first flexible plate 10 can be bent in any direction, and the bending in each direction has a maximum bending limit, thus deflection of the first flexible plate 10 can be prevented, and the function of protecting the first flexible plate 10 can be realized. Similarly, besides that the second flexible pate 20 can be bent in the length direction or in the width direction, and the bending in the length direction or in the width direction has a maximum bending limit, the second flexible plate 20 also can be bent in other directions, and the bending in each of the other directions has a maximum bending limit.

As a preferable embodiment, the first trapezoidal bosses 11 and the second trapezoidal bosses 12 are sealed in the gap 10a, thus the first trapezoidal bosses 11 and the second trapezoidal bosses 12 can be protected.

Figure 3:
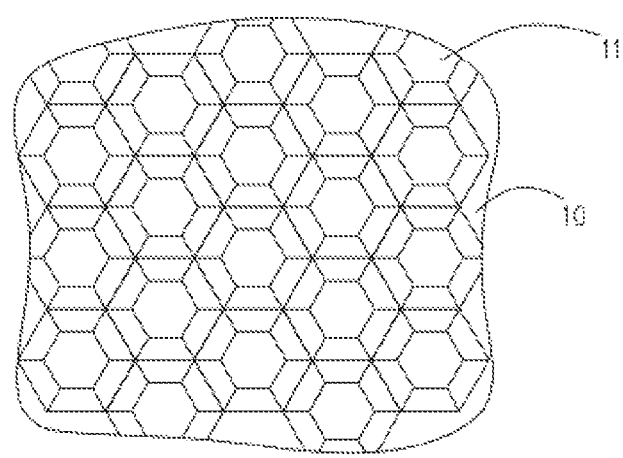
FIG. 3 is a schematic view of first trapezoidal bosses of the flexible screen protection structure of FIG. 1, the first trapezoidal bosses being hexagonal trapezoidal pattern.
Figure 4:
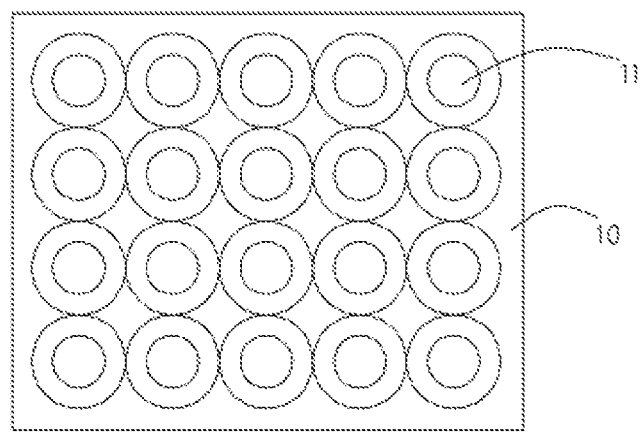
FIG. 4 is a schematic view of the first trapezoidal bosses of the flexible screen protection structure of FIG. 1, the first trapezoidal bosses being trapezoidal truncated cones.

In other embodiments, the first trapezoidal bosses 11 also can be hexagonal trapezoidal frustums of pyramids (that is, cross sections of the first trapezoidal bosses are regular hexagon, as shown in FIG. 3) or trapezoidal truncated cones (that is, cross sections of the trapezoidal bosses are circular, as shown in FIG. 4) and so on. Compared with the trapezoidal frustums of square pyramids, structures such as multi-angular trapezoidal frustums of pyramids (for example, hexagonal trapezoidal frustums of pyramids) and trapezoidal tnincated cones are more advantageous for bending the flexible screen protection structure 100 in multiple directions.

Furthermore, the first flexible plate 10 is made from an elastic material. As a preferable embodiment, the elastic material is polyethylene fiber. Under the effect of an external force, no matter the flexible screen protection structure 100 is bent toward the side of the first flexible plate 10 or toward the side of the second flexible plate 20, the first flexible plate 10 is always in a bent state. After the external force is removed, molecular chains of the first flexible plate 10 are turned into an extended state from the bent state through molecules stress of the first flexible plate 10, so that the first flexible plate 10 is enabled to restore to an expanded state. In other embodiments, the first flexible plate 10 also can be made from an elastic material such as highly elastic rubber or highly elastic carbon fiber.

Furthermore, the second flexible plate 20 is also made from an elastic material. As a preferable embodiment, the second flexible plate 20 can be made from the above mentioned polyethylene fiber, highly elastic rubber, or highly elastic carbon fiber. The principle applied to the second flexible plate 20 is the same as that applied to the first flexible plate 10, which will not be repeated herein.

Furthermore, the side plate 30 is made from an elastic material. As a preferable embodiment, the side plate 30 can be made from polyethylene fiber. As the side plate 30 is bonded to the peripheral sides of the first flexible plate 10 and the second flexible plate 20, when the first flexible plate 10 is bent with respect to the second flexible plate 20 under the effect of an external force or when the second flexible plate 20 is bent with respect to the first flexible plate 10 under the effect of an external force, a dislocation will be generated between the first flexible plate 10 and the second flexible plate 20, so the side plate 30 also will be deformed. After the external force is removed, molecular chains of the side plate 30 are turned into a natural extended state from the deformed state through the molecules stress of the side plate 30, so that the side plate 30 is enabled to restore to its natural state, and the dislocation between the first flexible plate 10 and the second flexible plate 20 is eliminated. In other embodiments, the side plate 30 is made from highly elastic rubber or a highly elastic carbon fiber.

Figure 5:
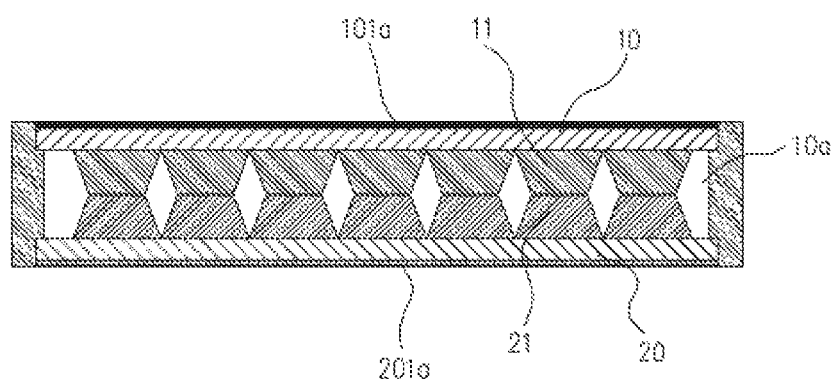
FIG. 5 is a schematic view showing the first flexible plate and a second flexible plate of the flexible screen protection structure of FIG. 1 magnetically attracted to each other.

Furthermore, referring to FIG. 5, the first flexible plate 10 and the second flexible 20 are magnetically attracted to each other. As a preferable embodiment, the first flexible plate 10 is coated with a first magnetic layer 101a, and the second flexible plate 20 is coated with a second magnetic layer 201a. By the property that the first flexible plate 10 and the second flexible 20 can attract each other, the first trapezoidal bosses 11 are caused to abut against the second trapezoidal bosses 21 under the effect of a magnetic force, so that the first trapezoidal bosses 11 cannot be easily disengaged from the second trapezoidal bosses 21, neither the first flexible plate 10 nor the second flexible plate 20 can easily produce raised deformation, thus performances of the flexible screen protection structure 100 can be further enhanced.

Furthermore, an atmospheric pressure intensity inside the gap 10a is smaller than an atmospheric pressure intensity outside the flexible screen protection structure 100. In another embodiment, air inside the gap 10a can be extracted, so that the gap 10a is evacuated, and so that the atmospheric pressure intensity in the gap 10a is smaller than the atmospheric pressure intensity outside the flexible screen protection structure 100, thus both the first outer surface 101 of the first flexible plate 10 and the second outer surface 201 of the second flexible plate 20 are subjected to a pressure difference of the external pressure intensity, so that the first flexible plate 10 and the second flexible plate 20 cannot be easily separated, the first flexible plate 10 and the second flexible plate 20 can be prevented from producing the raised deformation, and the performances of the flexible screen protection structure 100 can be further improved. In other embodiments, the preferable embodiment in which the first flexible plate 10 and the second flexible plate 20 are magnetically attracted to each other also can be combined with the present embodiment.

Figure 6:
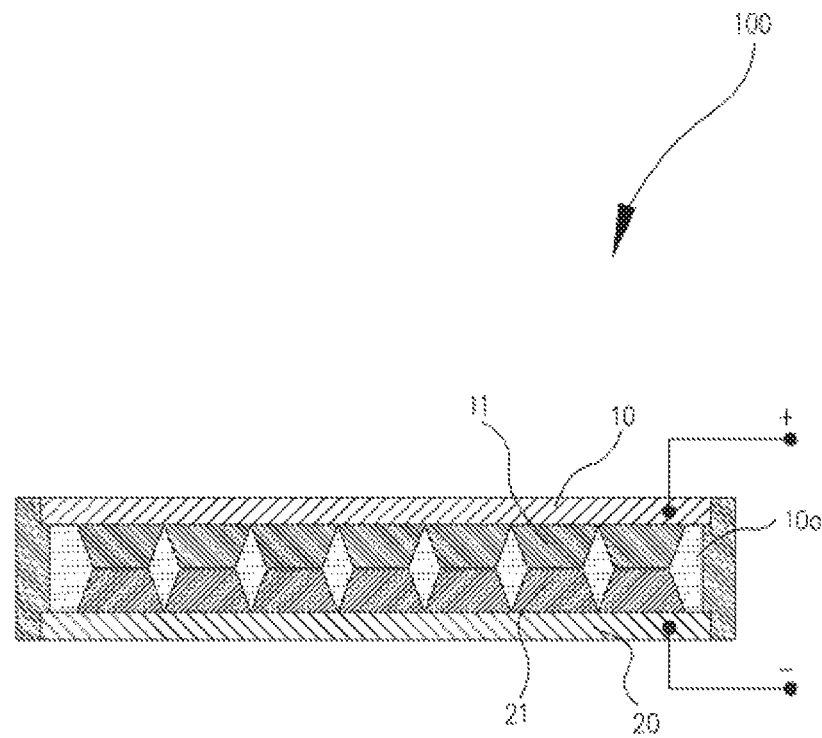
FIG. 6 is a sectional schematic view of a flexible screen protection structure in accordance with a second embodiment of the present disclosure.

Furthermore, as shown in FIG. 6, the present disclosure provides the flexible screen protection structure 100 of a second embodiment. The present embodiment is substantially the same as the first embodiment, and the difference is that the gap 10a is filled with electrorheological fluid, and a voltage can be applied between the first flexible plate 10 and the second flexible plate 20.

As a preferable embodiment, the first flexible plate 10 is a metal plate, and the second flexible plate 20 is a metal plate. The first flexible plate 10 and the second flexible plate 20 can be respectively electrically coupled to an anode and a cathode of a power source (not shown in the figures), so that a voltage is generated between the first flexible plate 10 and the second flexible plate 20. For example, when the first flexible plate 10 is coupled to the anode of the power source, and the second flexible plate 20 is coupled to the cathode of the power source, and the power source coupled to the first flexible plate 10 and the second flexible plate 20 is powered on, a voltage is generated between the first flexible plate 10 and the second flexible plate 20, so that the electrorheological fluid inside the gap 10a is turned from a liquid state into a solid state, thus a support structure of a solid plate is presented between the first flexible plate 10 and the second flexible plate 20, thus the flexible screen protection structure 100 cannot be deformed. That is, after the flexible screen protection structure 100 is bent to a predetermined shape under the effect of an external force, and a voltage is applied to the flexible screen protection structure 100, and when the external force is removed, the flexible screen protection structure 100 still cannot restore to the expanded state, so that the flexible screen protection structure 100 is shaped into a predetermined state. In other embodiments, both the first flexible plate 10 and the second flexible plate 20 can be metal plates having high elasticity. When the power source is not switched on, the flexible screen protection structure 100 can be bent freely, and the flexible screen protection structure 100 can restore to the expanded state after the external force is removed. When the flexible screen protection structure 100 is bent into the predetermined state under the effect of an external force, the power source is then switched on, the flexible screen protection structure 100 is shaped into the predetermined state.

Furthermore, under the expanded state without an external force, the first trapezoidal bosses 11 are respectively arranged opposite to the second trapezoidal bosses 21 one to one. With such structure, the support structure of the flexible screen protection structure 100 is strengthened, and the pressure resistance of the flexible screen protection structure 100 is enhanced.

Figure 7:
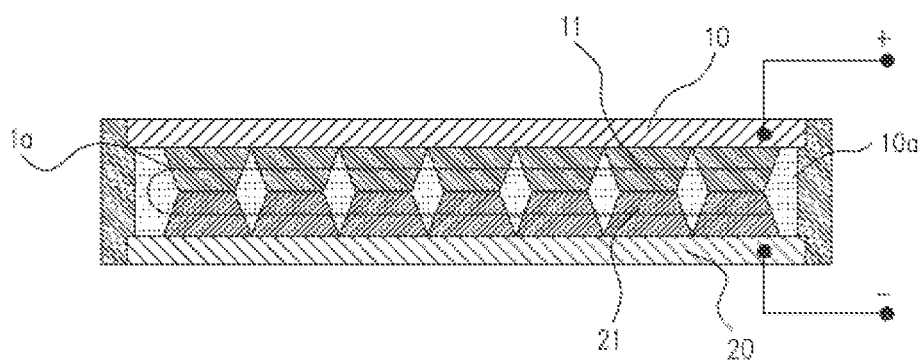
FIG. 7 is a schematic view showing first trapezoidal bosses and second trapezoidal bosses of the flexible screen protection structure of FIG. 6 coupled in series through a cable.

As a preferable embodiment, as shown in FIG. 7, the first trapezoidal bosses 11 and the second trapezoidal bosses 21 are coupled in series through a cable. Specifically, the first trapezoidal bosses 11 are firstly coupled in series through a cable 1a, and then the second trapezoidal bosses 21 are successively coupled in series through the cable 1a. Thus, the first trapezoidal bosses 11 cannot be easily disengaged from the second trapezoidal bosses 21, neither the first flexible plate 10 nor the second flexible plate 20 will produce the raised deformation, thus enhancing performances of the flexible screen protection structure 100. In other embodiments, each corresponding column of the first trapezoidal bosses 11 and the second trapezoidal bosses 21 are firstly coupled in series, or each corresponding row of the first trapezoidal bosses 11 and the second trapezoidal bosses 21 are coupled in series.

Figure 8:
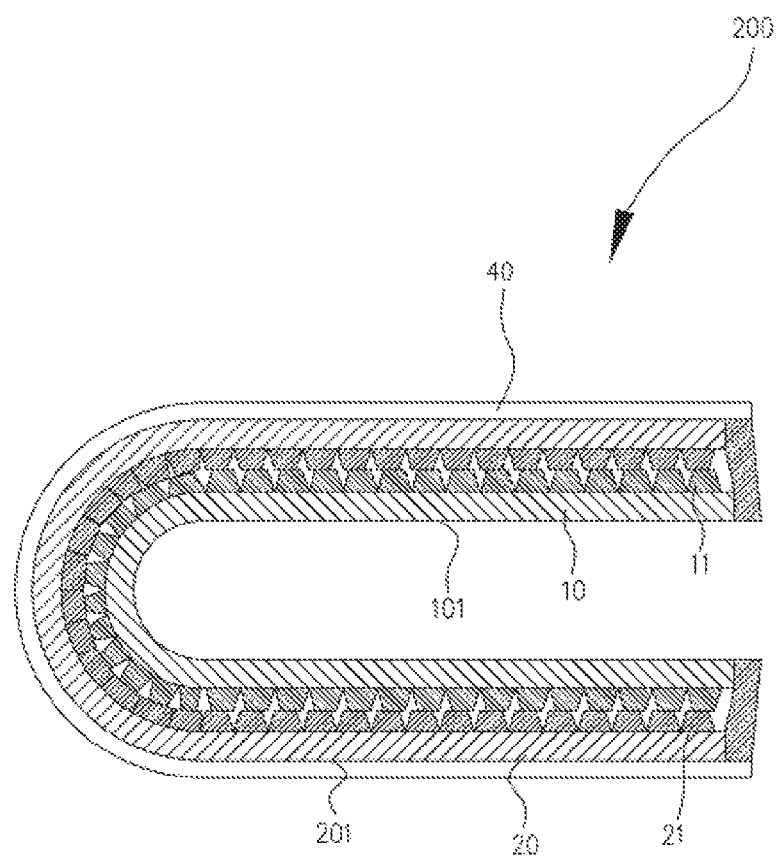
FIG. 8 is a sectional schematic view of a flexible display screen of the present disclosure.

Referring to FIG. 8, the present disclosure further provides a flexible display screen 200. The flexible display screen 200 includes the flexible screen protection structure 100 and an organic light-emitting display layer 40. The organic light-emitting display layer 40 is stacked on the flexible screen protection structure 100. Specifically, the organic light-emitting display layer 40 can be stacked on the first outer surface 101 of the first flexible plate 10, and also can be stacked on the second outer surface 201 of the second flexible plate 20. In other embodiments, the organic light-emitting display layer 40 also can be stacked between the first trapezoidal bosses 11 and the second trapezoidal bosses 21.

Figure 9:
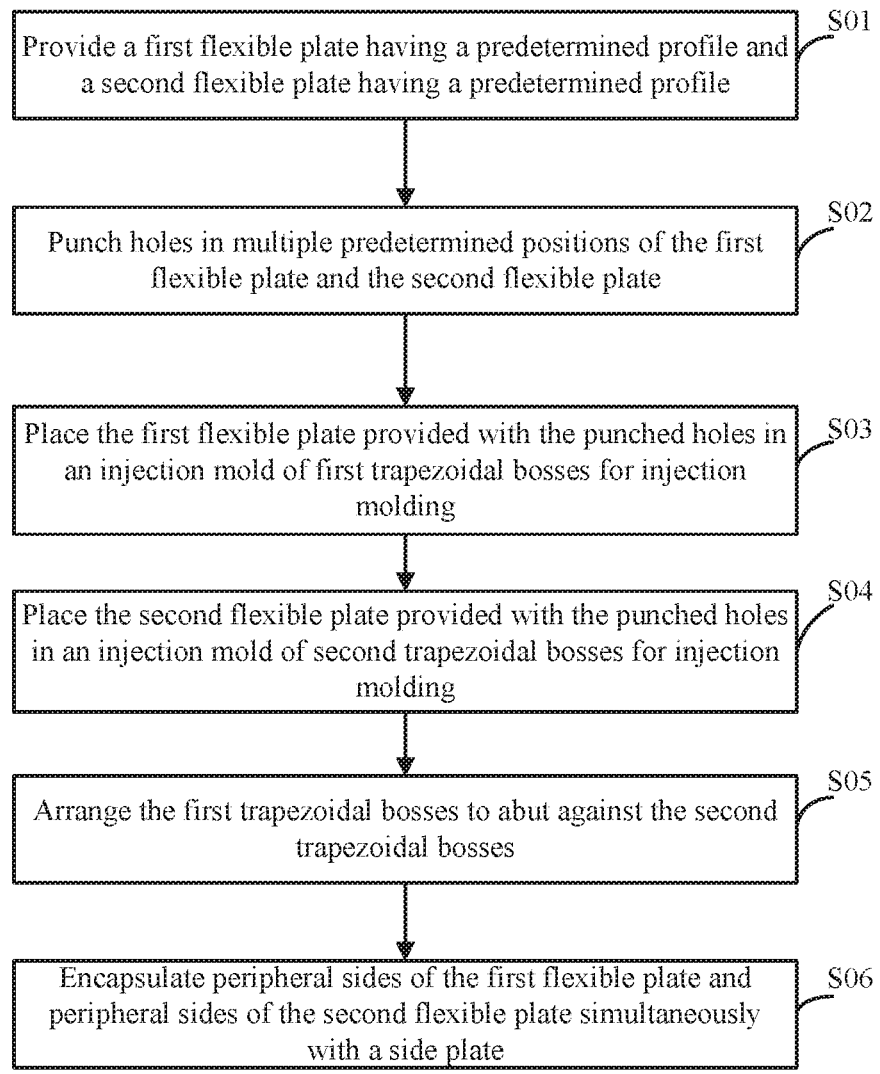
FIG. 9 is a flow chart of a method for manufacturing a flexible screen protection structure of the present disclosure.

Referring to FIG. 9, the present disclosure further provides a method for manufacturing a flexible screen protection structure. The flexible screen protection structure 100 can be manufactured by the method. The method may include the following steps.

S01: a first flexible plate having a predetermined profile and a second flexible plate having a predetermined profile are provided.

In the embodiment, the predetermined profile is in a rectangular shape, that is, the first flexible plate and the second flexible plate are rectangular plates.

S02: holes are punched in multiple predetermined positions of the first flexible plate and the second flexible plate.

The punched holes in the multiple predetermined positions are arranged into array on the first flexible plate and the second flexible plate;

S03: The first flexible plate provided with the punched holes is placed in an injection mold of first trapezoidal bosses for injection molding.

In the present embodiment, the first trapezoidal bosses are shaped in the punched holes.

S04: the second flexible plate provided with the punched holes is placed in an injection mold of second trapezoidal bosses for injection molding.

In the present embodiment, the second trapezoidal bosses are shaped in the punched holes.

S05: the first trapezoidal bosses are arranged to abut against the second trapezoidal bosses.

S06: peripheral sides of the first flexible plate and peripheral sides of the second flexible plate are simultaneously encapsulated with a side plate.

In other embodiments, when the first flexible plate 10 and the second flexible plate 20 have the same structure, and the first trapezoidal bosses 11 and the second trapezoidal bosses 21 have the same structure, the step S03 and the step S04 also can be combined into one step for carrying out.

For the flexible screen protection structure of the present disclosure, by providing the first trapezoidal bosses and the second trapezoidal bosses respectively on the first flexible plate and the second flexible plate, and using the clearances existing between the small ends of the first trapezoidal bosses and the clearances existing between the small ends of the second trapezoidal bosses, the flexible screen protection structure can be bent to a certain degree. When the flexible screen protection structure is to be deflected, the small ends of the first trapezoidal bosses or the small ends of the second trapezoidal bosses abut against each other, so that the flexible screen protection structure cannot be bent any longer, thus deflection of the flexible screen protection structure can be prevented, and the deflection resistance can be further improved.

The above-mentioned are merely for preferable embodiments of the present disclosure. It shall be indicated that for a person ordinarily skilled in the art, improvements and modifications still can be made within the principle of the present disclosure, and these improvements and modifications also should be considered as the protection scope of the present disclosure.

What is claimed is:

1. A flexible screen protection structure, comprising:
   a first flexible plate;
   a second flexible plate opposite to the first flexible plate, wherein a gap is formed between the first flexible plate and the second flexible plate;
   a side plate surrounding peripheral sides of the first flexible plate and peripheral sides of the second flexible plate and closing the gap;
   a plurality of first trapezoidal bosses densely distributed on the first flexible plate and located in the gap, wherein each of the plurality of the first trapezoidal bosses comprises a large end attached to the first flexible plate and a small end facing the second flexible plate; and
   a plurality of second trapezoidal bosses densely distributed on the second flexible plate and located in the gap, wherein each of the plurality of the second trapezoidal bosses comprises a large end attached to the second flexible plate and a small end facing the first flexible plate; wherein, the plurality of the first trapezoidal bosses and the plurality of the second trapezoidal bosses are trapezoidal truncated cones.

2. The flexible screen protection structure of claim 1, wherein the first flexible plate is made from an elastic material, and the first flexible plate is able to restore to an expanded state after being bent.

3. The flexible screen protection structure of claim 1, wherein the second flexible plate is made from an elastic material, and the second flexible plate is able to restore to an expanded state after being bent.

4. The flexible screen protection structure of claim 1, wherein the side plate is made from an elastic material, and the side plate is able to restore to an expanded state after being bent.

5. The flexible screen protection structure of claim 1, wherein the gap is filled with electrorheological fluid, and a voltage is allowed to be applied between the first flexible plate and the second flexible plate.

6. The flexible screen protection structure of claim 1, wherein the first flexible plate and the second flexible plate are magnetically attracted to each other.

7. The flexible screen protection structure of claim 1, wherein the plurality of the first trapezoidal bosses and the plurality of the second trapezoidal bosses are coupled in series through a cable.

8. The flexible screen protection structure of claim 1, wherein the plurality of the first trapezoidal bosses are arranged into array on the first flexible plate, and the plurality of the second trapezoidal bosses are in arranged into array on the second flexible plate.

9. The flexible screen protection structure of claim 8, wherein the plurality of the first trapezoidal bosses and the plurality of the second trapezoidal bosses are trapezoidal truncated cones.

10. The flexible screen protection structure of claim 1, wherein an atmospheric pressure intensity in the gap is smaller than an atmospheric pressure intensity outside the flexible screen protection structure.

11. A flexible display screen, comprising:
    a flexible screen protection structure; and
    an organic light-emitting display layer stacked on the flexible screen protection structure;
    wherein the flexible screen protection structure comprising:
    a first flexible plate;
    a second flexible plate opposite to the first flexible plate, wherein a gap is formed between the first flexible plate and the second flexible plate;
    a side plate surrounding peripheral sides of the first flexible plate and peripheral sides of the second flexible plate and closing the gap;
    a plurality of first trapezoidal bosses densely distributed on the first flexible plate and located in the gap, wherein each of the plurality of the first trapezoidal bosses comprises a large end attached to the first flexible plate and a small end facing the second flexible plate; and
    a plurality of second trapezoidal bosses densely distributed on the second flexible plate and located in the gap, wherein each of the plurality of the second trapezoidal bosses comprises a large end attached to the second flexible plate and a small end facing the first flexible plate; wherein, the plurality of the first trapezoidal bosses and the plurality of the second trapezoidal bosses are trapezoidal truncated cones.

12. The flexible display screen of claim 11, wherein the organic light-emitting display layer is stacked on a surface of the first flexible plate facing away from the second flexible plate or on a surface of the second flexible plate facing away from the first flexible plate.

13. The flexible display screen of claim 11, wherein the gap is filled with electrorheological fluid, and a voltage is allowed to be applied between the first flexible plate and the second flexible plate.

14. The flexible display screen of claim 11, wherein the first flexible plate and the second flexible plate are magnetically attracted to each other.

15. The flexible display screen of claim 11, wherein the plurality of the first trapezoidal bosses and the plurality of the second trapezoidal bosses are coupled in series through a cable.

16. The flexible display screen of claim 11, wherein the plurality of the first trapezoidal bosses are arranged into array on the first flexible plate, and the plurality of the second trapezoidal bosses are in arranged into array on the second flexible plate.

17. The flexible display screen of claim 16, wherein the plurality of the first trapezoidal bosses are respectively provided opposite to the plurality of the second trapezoidal bosses one to one.

* * * * *